US012633904B2

(12) United States Patent
Begino, III et al.

(10) Patent No.: US 12,633,904 B2
(45) Date of Patent: May 19, 2026

(54) CONFIGURABLE FAST TRANSITION PULSE POWER SUPPLY UNIT

(71) Applicant: Advanced Energy Industries, Inc., Denver, CO (US)

(72) Inventors: John Faustino Boqueo Begino, III, Pasig (PH); Nathaniel Franco Neri, Taguig (PH)

(73) Assignee: AES Global Holdings PTE. Ltd., Singapore (SG)

( * ) Notice: Subject to any disclaimer, the term of this patent is extended or adjusted under 35 U.S.C. 154(b) by 0 days.

(21) Appl. No.: 18/916,956

(22) Filed: Oct. 16, 2024

(65) Prior Publication Data

US 2026/0106601 A1     Apr. 16, 2026

(51) Int. Cl.
| | |
|---|---|
| *H03K 5/01* | (2006.01) |
| *H02M 1/34* | (2007.01) |
| *H03K 3/013* | (2006.01) |
| *H03K 3/02* | (2006.01) |

(52) U.S. Cl.
CPC ............ *H03K 3/013* (2013.01); *H02M 1/348* (2021.05); *H03K 3/02* (2013.01)

(58) Field of Classification Search
CPC ............ H03K 3/01; H03K 3/013; H03K 3/02; H03K 5/01; H03K 5/08; H03K 5/082; H03K 5/084; H03K 5/086; H03K 5/088; H03K 17/687; H03K 17/6871; H03K 17/6874; H03K 2217/0081; H02M 1/32; H02M 1/34; H02M 1/348
See application file for complete search history.

(56) References Cited

U.S. PATENT DOCUMENTS

| | | | |
|---|---|---|---|
| 5,923,547 A | 7/1999 | Mao | |
| 8,730,696 B2 | 5/2014 | Barbosa | |
| 10,673,320 B2 | 6/2020 | Higashiyama et al. | |
| 11,245,339 B2 * | 2/2022 | Telefus | G05F 1/66 |
| 12,095,383 B2 * | 9/2024 | Telefus | H02M 1/32 |

OTHER PUBLICATIONS

Wu Tong et al: "Medium Voltage DC Transformer with Series-Connected Power Devices Based on Active Clamping Circuit", 2023 IEEE Energy Conversion Congress and Exposition (ECCE) IEEE, Oct. 29, 2023 (Oct. 29, 2023), pp. 6240-6246.
International Search Report & Written Opinion for PCT Application No. PCT/SG2025/050676, mailed Jan. 28, 2026; 14 pages.

* cited by examiner

*Primary Examiner* — Long Nguyen

(57) ABSTRACT

A system includes a base PSU having a voltage output, an extender PSU having a voltage output coupled in series with the voltage output of the base PSU, and a pulse switch circuit. The pulse switch circuit includes a voltage input coupled with the voltage output of the base PSU and with the voltage output of the extender PSU, a voltage output, a base switch assembly coupled in series between the voltage output of the base PSU and the voltage output of the pulse switch circuit, an extender switch assembly coupled in series between the voltage output of the extender PSU and the voltage output of the pulse switch circuit, and a clamp circuit. A controller is configured to control the base switch assembly, the extender switch assembly, and the clamp circuit based on an input received from a load sensor coupled to a load.

20 Claims, 6 Drawing Sheets

CONFIGURABLE FAST TRANSITION PULSE POWER SUPPLY UNIT

TECHNICAL FIELD

Aspects of the disclosure relate to power supply units and more particularly to producing output pulses usable by a load.

BACKGROUND

A power supply unit (PSU) typically converts an incoming voltage into a different output voltage. For example, an alternating current (AC) input voltage may be converted to a direct current (DC) voltage for use by electronic equipment. In another example, a first DC input voltage may be converted to a different DC voltage for use by the electronic equipment.

The PSU may be coupled to a pulse load where PSU provides energy pulses to the load. The timing and shape of the pulses received at the load can be affected by the transmission medium between the PSU and the load. In many cases, the transmission medium can be a cable that includes an inherent inductance that can affect the pulse transmitted by the PSU over the cable. For example, the inherent inductance can affect the rise time and the fall time of the transmitted pulse such that the pulse received by the load is altered from the pulse generated by the PSU. For high-frequency processes, alterations in the transmitted pulses from the PSU to the load can reduce process optimization and efficiency. Improvements in the generation of the pulses can, therefore, improve operation and efficiency by the load.

SUMMARY

In accordance with one aspect of the present disclosure, a system for supplying an energy pulse to a load, the system includes a base power supply unit (base PSU) having a voltage output, an extender PSU having a voltage output coupled in series with the voltage output of the base PSU, and a pulse switch circuit. The pulse switch circuit includes a voltage input coupled with the voltage output of the base PSU and with the voltage output of the extender PSU, a voltage output, a base switch assembly coupled in series between the voltage output of the base PSU and the voltage output of the pulse switch circuit, an extender switch assembly coupled in series between the voltage output of the extender PSU and the voltage output of the pulse switch circuit, and a clamp circuit coupled across the voltage output of the pulse switch circuit. The system also includes a load sensor coupled to the load and a controller configured to control the base switch assembly, the extender switch assembly, and the clamp circuit based on an input received from the load sensor.

In accordance with another aspect of the present disclosure, a pulse switch circuit includes a base voltage input comprising a pair of input terminals configured to receive energy from a base power supply unit (base PSU), an extender voltage input comprising an extender input terminal configured to receive energy from an extender PSU, and a voltage output comprising a pair of output terminals. The pulse switch circuit also includes a base switch assembly coupled in series between a first input terminal of the pair of input terminals of the base voltage input and the voltage output, an extender switch assembly coupled in series between the input terminal of the extender voltage input and the voltage output, a clamp circuit coupled in parallel between the pair of output terminals, and a controller configured to control the base switch assembly, the extender switch assembly, and the clamp circuit to generate an energy pulse to a load.

In accordance with another aspect of the present disclosure, a method of controlling a pulse switch circuit to generate an energy pulse for a load, the pulse switch circuit comprising a base voltage input, an extender voltage input, a voltage output, a base switch assembly coupled in series between the base voltage input and the voltage output, an extender switch assembly coupled in series between the extender voltage input and the voltage output, a base capacitor, an extender capacitor, a clamp circuit coupled in parallel across the voltage output, and a controller. The method includes controlling the base switch assembly into a non-conducting mode and the extender switch assembly into a conducting mode during a first portion of a pulse cycle to cause energy stored in the base capacitor and in the extender capacitor to be supplied to the voltage output in series. The method also includes, in response to a first operating condition, controlling the base switch assembly into the conducting mode and the extender switch assembly into the non-conducting mode during a second portion of the pulse cycle to cause energy supplied to the base voltage input via a base power supply unit (base PSU) to be supplied to the voltage output and to prevent energy supplied to the extender voltage input via an extender PSU from being supplied to the voltage output. The method also includes, in response to a second operating condition, controlling the base switch assembly and the extender switch assembly into the non-conducting mode during a third portion of the pulse cycle. The method also includes storing energy supplied to the voltage output in the clamp circuit during the third portion of the pulse cycle.

BRIEF DESCRIPTION OF THE DRAWINGS

The drawings illustrate embodiments presently contemplated for carrying out the invention.

In the drawings.

Figure 1:
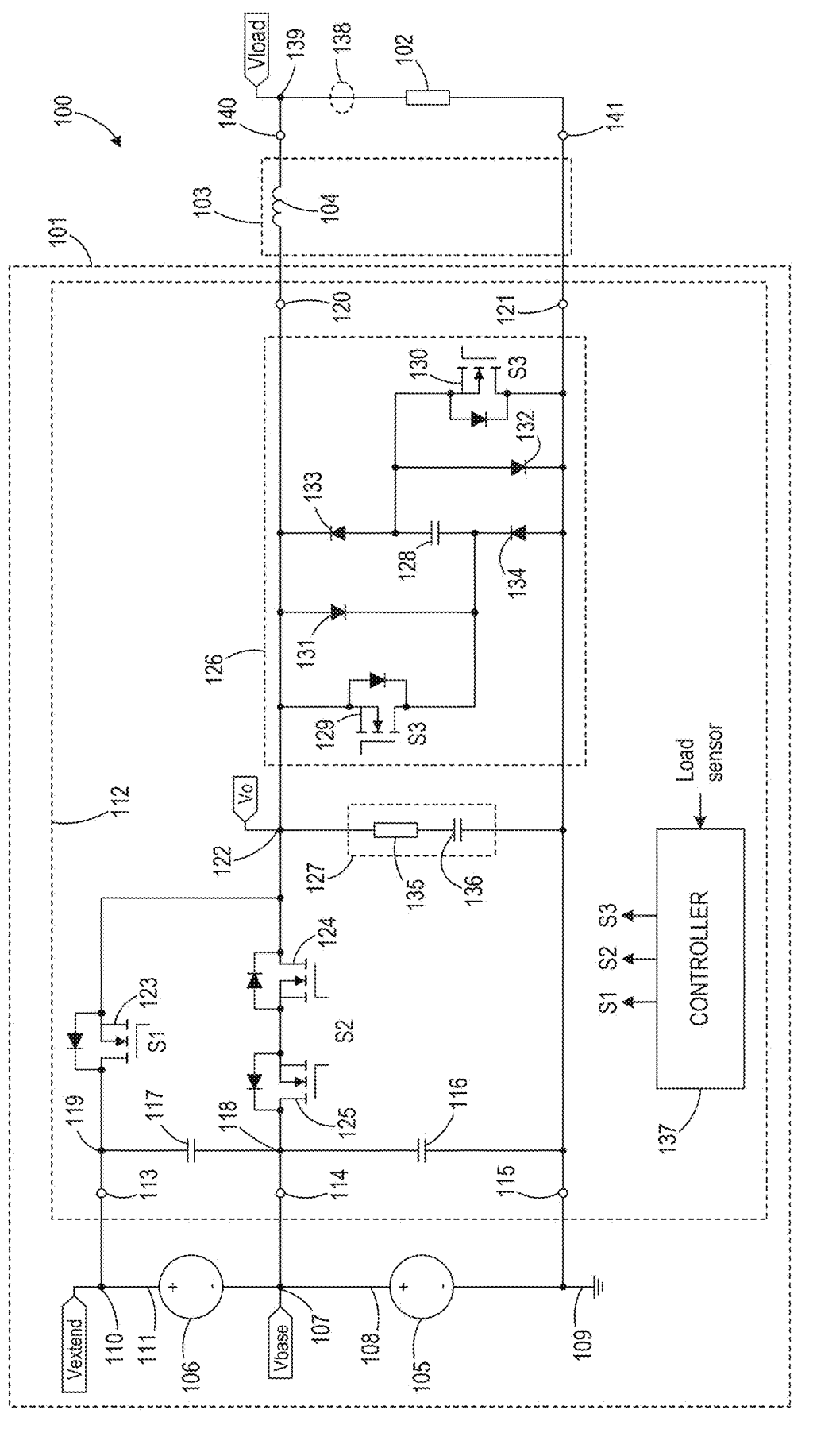
FIG. 1 is a schematic drawing of a power supply unit system according to an aspect of this disclosure.

While the present disclosure is susceptible to various modifications and alternative forms, specific embodiments thereof have been shown by way of example in the drawings and are herein described in detail. It should be understood, however, that the description herein of specific embodiments is not intended to limit the present disclosure to the particular forms disclosed, but on the contrary, the intention is to cover all modifications, equivalents, and alternatives falling within the spirit and scope of the present disclosure. Note that corresponding reference numerals indicate corresponding parts throughout the several views of the drawings.

DETAILED DESCRIPTION

Examples of the present disclosure will now be described more fully with reference to the accompanying drawings. The following description is merely exemplary in nature and is not intended to limit the present disclosure, application, or uses.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Although the disclosure hereof is detailed and exact to enable those skilled in the art to practice the invention, the physical embodiments herein disclosed merely exemplify the invention which may be embodied in other specific structures. While the preferred embodiment has been described, the details may be changed without departing from the invention, which is defined by the claims.

FIG. 1 illustrates a schematic diagram of a pulse-based system 100 according to an aspect of this disclosure. A power supply unit (PSU) system 101 is coupled with a load 102 via a cable 103 or other connection medium. An inherent inductance of the connection medium (e.g., the cable 103) is illustrated as an inductor 104 for convenience in discussion and understanding. However, a physical inductor is not required within the connection medium, and it may be understood to represent one or more of the electrical properties of the connection medium when used to transmit energy from the PSU system 101 to the load 102.

The PSU system 101 includes a base PSU 105 serially coupled with an extender PSU 106. A node 107 between a positive voltage output terminal 108 of the base PSU 105 and the extender PSU 106 may be used to identify a voltage of the base PSU 105 compared with a common ground 109. Another node 110 coupled to a positive voltage output terminal 111 of the extender PSU 106 may be used, in one embodiment, to identify a combined voltage of the base PSU 105 and the extender PSU 106 when compared with the common ground 109. In another embodiment, the node 110 may be used to identify the voltage of the extender PSU 106 when compared with the node 107.

A pulse switch circuit 112 is included within the PSU system 101 for transmitting a pulse to the load 102 across the cable 103 from the base and extender PSUs 105, 106 as described herein. A plurality of voltage input terminals 113, 114, 115 are respectively coupled with the node 110, the node 107, and the common ground 109. A base capacitor 116 is coupled across the input terminals 114, 115 such that the base capacitor 116 is in parallel with the base PSU 105 when coupled as shown. An extender capacitor 117 is coupled across a base node 118 coupled with the input terminal 114 and an extender node 119 coupled with the input terminal 113 such that the extender capacitor 117 is in parallel with the extender PSU 106 when coupled as shown.

A pair of voltage output terminals 120, 121 of the pulse switch circuit 112 are coupled with the cable 103. An output voltage node (Vo node) 122 may be used to identify the voltage on the output terminal 120 when compared with the common ground 109. Serially coupled between the extender node 119 and the output terminal 120 is a first switch assembly S1 123 having a single controllable switch. In one embodiment, the controllable switch 123 is a metal-oxide-semiconductor field-effect transistor (MOSFET). When controlled into an active or on mode or state, the switch assembly S1 123 transmits energy from the extender node 119 to the output terminal 120. As discussed herein, the extender node 119 may be subjected to load power from the base PSU 105 and/or the extender PSU 106 as well as discharging currents from one or more of the base capacitor 116 and the extender capacitor 117. Additionally, the extender node 119 may be subjected to discharging current from a clamp capacitor (e.g., clamp capacitor 128) as discussed below.

A second switch assembly S2 having a pair of series-coupled controllable switches 124, 125 is serially coupled between the base node 118 and the output terminal 120. In one embodiment, the controllable switches 124, 125 are MOSFETs. A drain terminal of the switch 125 is coupled in series with the base node 118, and a drain terminal of the switch 124 is coupled in series with the Vo node 122. Further, the source terminals of the switches 124, 125 are serially coupled together. When controlled into an active or on mode or state, the switch assembly S2 124, 125 transmits energy from the base node 118 to the output terminal 120. As discussed herein, the base node 118 may be subjected to load power from the base PSU 105 as well as discharging currents from the base capacitor 116 and the clamp capacitor 128.

The PSU system 101 also includes a fast transition clamp circuit 126 and a transition snubber circuit 127 coupled across the output terminals 120, 121. In the fast transition clamp circuit 126, a clamp capacitor 128 is coupled in series with a pair of controllable switches 129, 130 of a switch assembly S3. When controlled into an active or on mode or state, the switch assembly S3 129 transmits discharging current from the clamp capacitor 128 to the Vo node 122. The fast transition clamp circuit 126 also includes a plurality of diodes: a first diode 131 is coupled in parallel with the controllable switch 129, a second diode 132 is coupled in parallel with the controllable switch 130, a third diode 133 is coupled between the Vo node 122 and the controllable switch 130, and a fourth diode 134 is coupled between the controllable switch 129 and the common ground 109. In the transition snubber circuit 127, a series-coupled snubber resistor 135 and snubber capacitor 136 suppress and/or reduce voltage and current stresses and transients within the PSU system 101 during switching transitions.

A controller 137 is coupled to the switch assemblies S1, S2, and S3 for controlling the on and off modes or states of the respective controllable switches 123-125, 129-130 according to a pulse sequence method or operation as described herein. A load sensor 138 coupled to sense a voltage and/or current supplied to the load on the load-side of the cable 103 provides one or more signals to the controller 137 during the pulse sequence method. The load sensor 138 senses or measures a voltage and or a current on a Vload node 139 coupled with a first load terminal 140 of a pair of load terminals 140, 141.

In the pulse-based system 100 shown in FIG. 1, the single base PSU 105 is sufficient to provide pulses satisfying the voltage and current requirements of the load. In an ideal circuit with ideal components such as the connection medium (e.g., cable 103) lacking an inherent inductance such that power is instantly provided to the load 102 from the base PSU 105, the pulse switch circuit 112 could be eliminated in favor of a direct connection of the base PSU 105 with the load 102. However, since ideal components and circuit function are not achievable in the real world where delay of the power supplied to the load 102 from the base PSU 105 and other inefficiencies do exist, embodiments of this disclosure such as those based on the schematic diagram of FIG. 1 provide a way to minimize such delays and inefficiencies. For example, by providing the series-coupled extender PSU 106 and the fast transition clamp circuit 126, a quicker rise time to the target voltage level required by the load 102 is achieved; thus, shortening a delay caused by inductive properties within the cable 103. In response to reaching the target voltage level, the extra voltage and current supplied by the extender PSU 106 and the clamp capacitor 128 can be turned off for a remainder of the pulse width such that the base PSU 105 alone provides the output energy to the cable 103 and to the load 102. When the power from the base PSU 105 is turned off (e.g., by turning off the switch assembly S2), current inductively built up in the cable 103 slows the time it takes to allow the pulse to return to zero. Providing a current drain path through the fast transition clamp circuit 126 reduces the fall time delay, thus shortening the fall time.

Control of the pulse-based system 100 to achieve improved reductions in the rise and fall times of load pulses will now be discussed.

Figure 2:
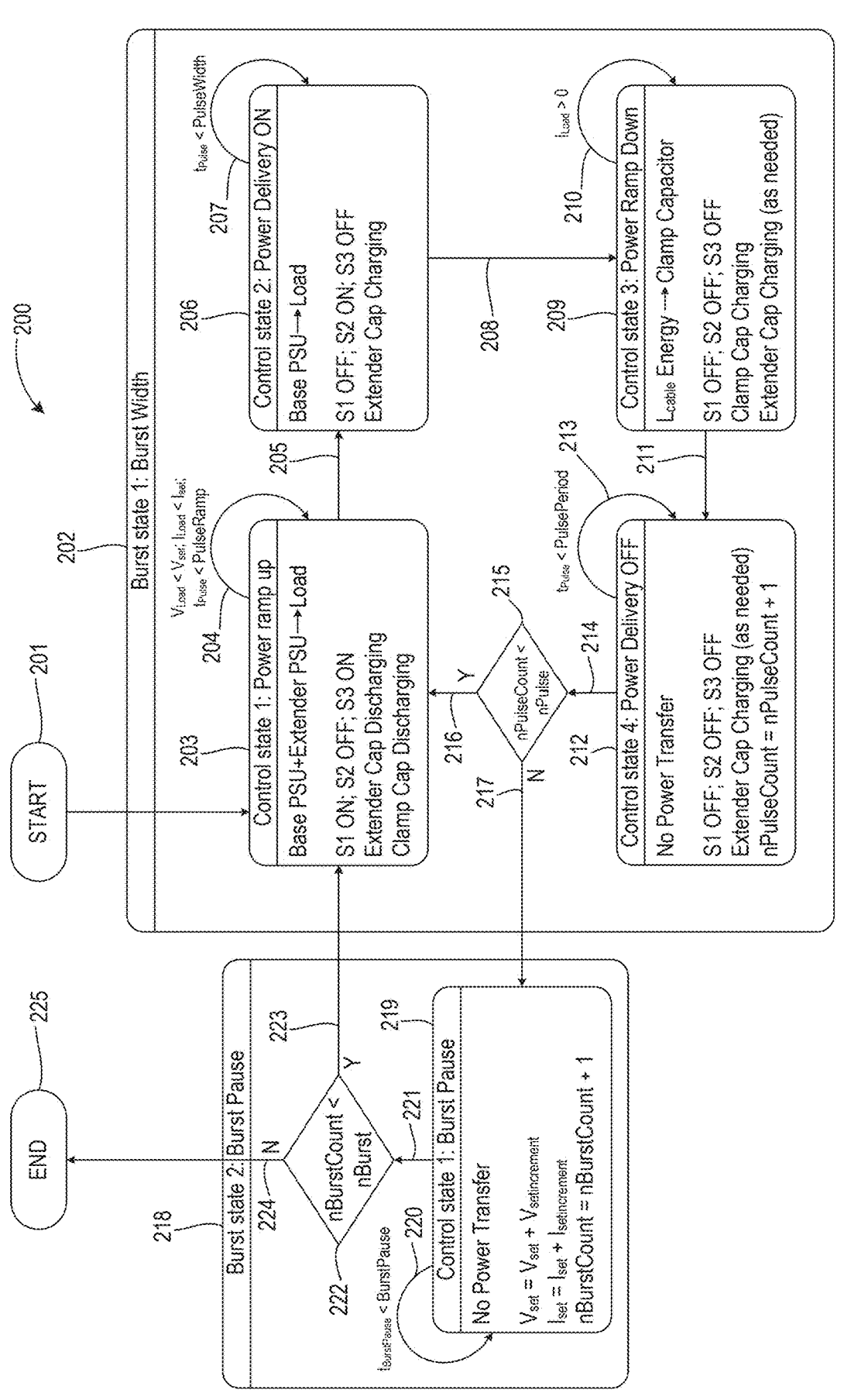
FIG. 2 illustrates a state diagram showing a method of generating one or more pulses via the PSU system of FIG. 1 according to an aspect of this disclosure.
Figures 3, 4:
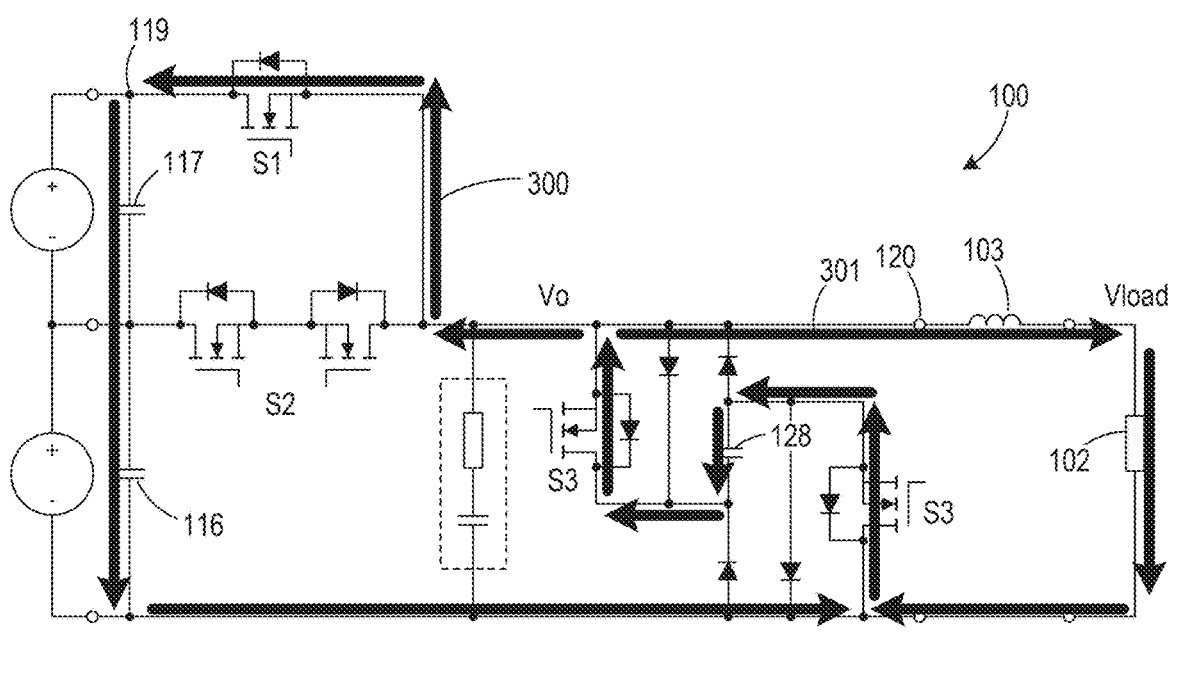
FIGS. 3-6 illustrate schematic diagrams showing current flow during one or more portions of the method of FIG. 2 according to an aspect of this disclosure.

FIG. 2 illustrates a state diagram showing a pulse sequence method 200 for generating one or more pulses via the PSU system 101 of FIG. 1 according to an aspect of this disclosure. Referring to FIGS. 1 and 2, the pulse sequence method 200 is executable by the controller 137 of FIG. 1 in an example. After starting the process 200 at step 201, a first burst state control 202 having a series of burst width states is executed. In a first burst width control state 203 (e.g., Control state 1: Power ramp up), the controller 137 simultaneously controls the controllable switches 123, 129-130 of the switch assemblies S1, S3 into their conducting or on modes or states. The controllable switches 124-125 of the switch assembly S2 are simultaneously controlled into their non-conducting or off modes or states. In an initial period during this Control state 1 203, the control of the switch assembly S3 129, 130 into its conducting mode or state discharges stored energy in the clamp capacitor 128 onto the Vo node 122. The voltage of the clamp capacitor 128, being greater than the voltage on the extender node 119, allows a portion of the discharge current from the clamp capacitor 128 to flow through the extender capacitor 117 and the base capacitor 116 to charge them to a higher voltage than the voltages of the base PSU 105 and the extender PSU 106. Referring temporarily to FIG. 3, a first portion 300 of the current stored in the clamp capacitor 128 is shown flowing through the extender capacitor 117 and the base capacitor 116. A second portion 301 of the current stored in the clamp capacitor 128 flows through the cable 103 and through the load 102.

Returning to FIGS. 1 and 2 and also referring to FIG. 4, upon reaching an equilibrium with the voltage on the extender node 119, energy is transmitted to the output terminal 120 based on the series combination of voltage/current from the base PSU 105 and the extender PSU 106, based on the series combination of voltage/current from the base capacitor 116 and the extender capacitor 117, and based on the discharge current from the clamp capacitor 128.

During this Control state 1 203, the discharge energies from the clamp capacitor 128 and from the series-combined base and extender capacitors 116, 117 and the supply energy from the series-combined base and extender PSUs 105, 106 supplied to the load 102 through the cable 103 is higher than when supplied by the base PSU 105 alone. In one example, the voltages of the base PSU 105 and the extender PSU 106 are substantially the same, resulting in a doubling of the voltage supplied to the load 102 while the switch assemblies S1 and S3 are conducting. Due to the inductive nature of the cable 103, the supplied voltage and current are slowed such that the target load voltage and current are not immediately provided to the load 102 by switching on the switch assemblies S1 and S3. However, due to the higher (e.g., doubled) voltage supplied by the combination of the base and extender PSUs 105, 106, the target voltage received at the load 102 after passing through the cable 103 is reached faster than by the base PSU 105 alone. In another embodiment, the energy supplied by the extender PSU 106 may be higher or lower than that supplied by the base PSU 105.

Figure 5:
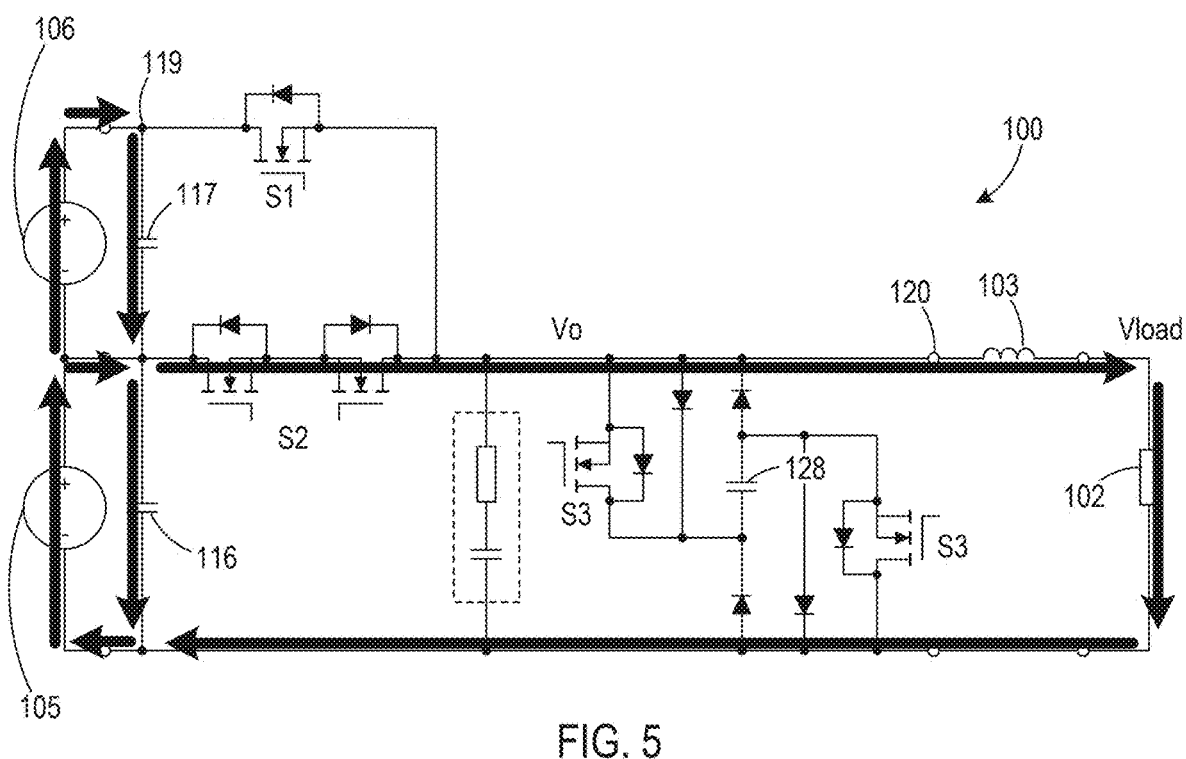

As indicated by the state condition arrow 204, control of the switch assemblies S1-S3 remains in any or all of the following conditions: the voltage at the load (Vload) is less than a set voltage (Vset) or target voltage for the pulses received through the cable 103, the load current (Iload) is less than the set current (Iset) or target current for the pulses received through the cable 103, or a pulse time (tpulse) is less than a PulseRamp time. The Vload and Iload conditions can be measured by a sensor such as the load sensor 138 of FIG. 1 and provided to the controller 137. In response to meeting any of the set or time conditions, the method 200 proceeds at step 205 to a second burst width control state 206 (e.g., Control state 2: Power Delivery ON). During Control state 2 206, the controller 137 simultaneously controls the controllable switches 123, 129-130 of the switch assemblies S1, S3 into their non-conducting or off modes or states. The controllable switches 124-125 of the switch assembly S2 are simultaneously controlled into their conducting or on modes or states. As a result, energies supplied to the Vo node 122 by the extender PSU 106, the extender capacitor 117, and the clamp capacitor 128 are stopped, and the energy supplied to the Vo node 122 is provided by the base PSU 105 and the base capacitor 116. Though the extender PSU 106 does not provide energy to the Vo node 122 and to the load 102, it does provide energy to charge the extender capacitor 117. Referring temporarily to FIG. 5, a schematic diagram showing current flow during the second burst width control state 206 is illustrated.

Figure 6:
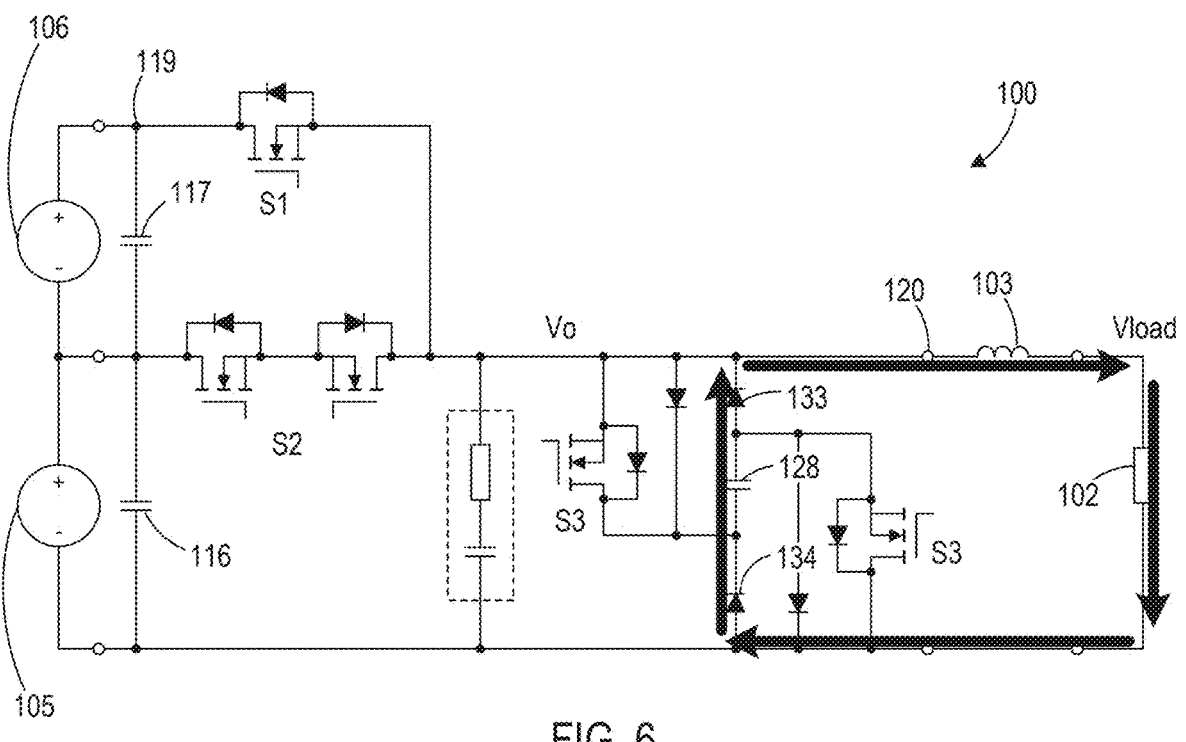

As indicated by the state condition arrow 207, control of the switch assemblies S1, S3 remains controlling the switch assemblies S1, S3 in their non-conducting or off modes or states and controlling the switch assembly S2 in its conducting or on mode or state while the pulse time (tpulse) is less than a Pulse Width time. [Need to add description of S2 124 125 switch on timing event—isn't this described in the previous paragraph?] In response to meeting the Pulse Width time, the method 200 proceeds at step 208 to a third burst width control state 209 (e.g., Control state 3: Power Ramp Down). During the third burst width control state 209, the controller 137 simultaneously controls all of the controllable switches 123-125, 129-130 into their non-conducting or off modes or states. As a result, energies supplied to the Vo node 122 by the base PSU 105 and the base capacitor 116 are also stopped. However, due to the inductive nature of the cable 103, inductive current remains flowing after turning off the switch assembly S2. As indicated in the block of the third burst width control state 209 and in the schematic flow diagram of FIG. 6, the inductive current flows through the clamp capacitor 128 via diodes 133, 134 to be stored and used during the first burst width control state 203 as described above. While the inductive current flows through the load 102, the load current (Iload) will be greater than zero. As indicated by the state condition arrow 210, Control State 3 209 will remain in control while the load current (Iload) is greater than zero.

In response to reaching the threshold set by the state condition indicated at arrow 210, the method 200 proceeds at step 211 to a fourth burst width control state 212 (e.g., Control state 4: Power Delivery OFF). During Control state 4 212, the controllable switches 123-125, 129-130 are maintained in their non-conducting or off modes or states by the controller 137 while, as indicated by the state condition arrow 213, a pulse time (tpulse) of the entire pulse is less than a PulsePeriod. As a result, gate voltages supplied to the control gates of the controllable switches 123-125, 129-130 are zero as are the output and supply voltages Vo and Vload. In addition, the supply current Iload is also zero.

Figure 7:
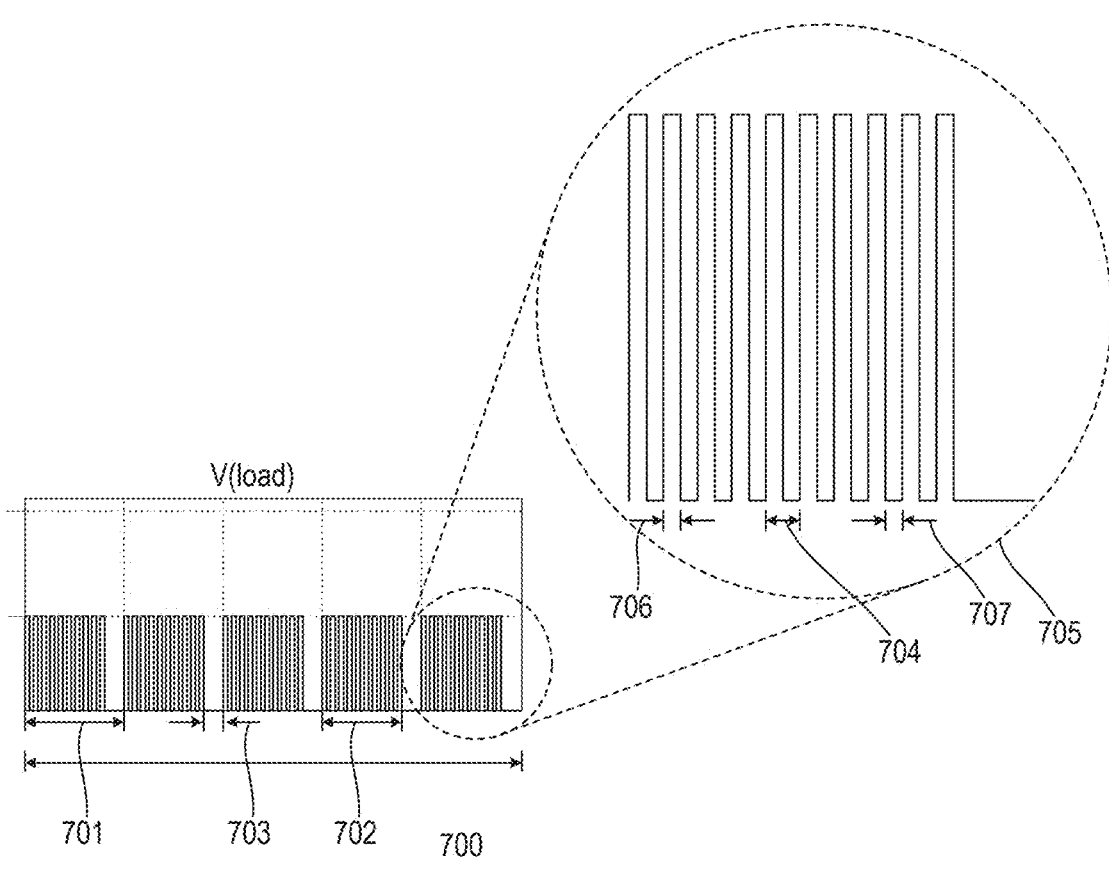
FIG. 7 illustrates a target pulse sequence capable of being generated using the apparatus and methods described herein according to an aspect of this disclosure.
Figure 8:
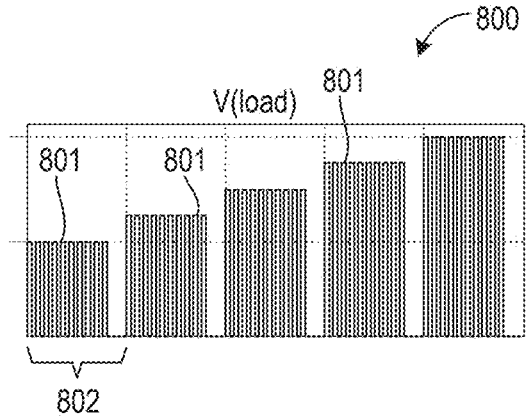
FIG. 8 illustrates a target pulse sequence capable of being generated using the apparatus and methods described herein according to an aspect of this disclosure.

In response to meeting the PulsePeriod threshold, the method 200 proceeds at step 214 to a decision block 215. At this point a single pulse period has elapsed in which a single pulse has been transmitted to the load 102. A series of pulses and bursts transmittable to the load 102 is illustrated in FIG. 7. As shown, a burst duration 700 of a plurality of burst periods 701 may be transmitted to the load 102. A burst period 701 includes a burst width 702 followed by a burst pause 703. Each burst width 702 includes a number of pulse periods 704 (illustrated in the callout circle 705). Similar to the burst period 701, each pulse period 704 includes a pulse width 706 and a pulse pause 707. As shown in FIG. 7, five burst periods 701 are shown, each having ten pulse periods 704. However, the number of pulse periods 704 in each burst period 701 and the number of burst periods 701 in the burst duration 700 illustrated in FIG. 7 is merely exemplary, and embodiment of this disclosure are not restricted to the number of bursts and pulses shown. Further, as illustrated in FIG. 8, a target pulse sequence 800 shows a successive increase in the voltage of the pulses 801 at the beginning of each new pulse burst 802. Thus, embodiment of this disclosure provides a wide variety of options available for generating pulses according to the demands of the pulse load 102.

Returning to FIG. 2, the decision block 215 determines whether the number of pulses in a current burst width (e.g., burst width 702) has been met. As shown in the block for the fourth burst width control state 212, the current number of transmitted pulses for the current burst width is incremented by one. In a condition similar to the pulse sequence illustrated in FIG. 7 or 8, for example, the decision block 215 may determine whether ten pulses have been sent in a current burst width. If the pulse count (e.g., 5) of the current burst width (nPulseCount) is less than the required number of pulses (e.g., 10) in the current burst width (nPulse), then the method 200 returns (step 216) to the first burst width control state 203 to repeat the pulse generation for a subsequent pulse as described above.

If the decision block 215 determines that the required number of pulses in the current burst width has been met, the method 200 proceeds at step 217 to a second burst state control 218 having a burst pause control state 219 (e.g., Control state 1: Burst Pause) that intruduces, the burst pause 703 illustrated in FIG. 7 between successive burst widths 702. In the burst pause control state 219, the set voltage (Vset) may be incremented to show successive increases in the pulse voltages shown in FIG. 8 in one embodiment. In addition the set current (Iset) may also be inremented. In other embodiments, however, the set voltage and set current may be decremented or remain the same as desired or required by the pulse load 102. In addition, the current number of bursts (nBurstCount) is incremented to keep track of the count of burst periods 701 transmitted so far in the current iteration of the pulse sequence method 200.

As shown by the state condition arrow 220, while a burst pause time (tBurstPause) remains less than a determined pause time (BurstPause), the burst pause control state 219 remains active, and no power is transferred or transmitted to the load 102 from the PSU system 101. In response to meeting or exceeding the burst pause threshold indicated by the state condition arrow 220, the method 200 proceeds at step 221 to a decision block 222 to determine if the number of bursts (nBurstCount) executed so far during the current iteration of the pulse sequence method 200 is less than a burst count threshold (nBurst). If the number of transmitted burst periods is less than the burst count threshold (nBurst), the method 200 returns at step 223 to the first burst state control 202 to generate a subsequent series of pulses in a burst width.

If the decision block 222 determines that the number of bursts (nBurstCount) executed so far during the current iteration of the pulse sequence method 200 is not less than the burst count threshold (nBurst), the method proceeds at step 224 to end 225.

Figure 9:
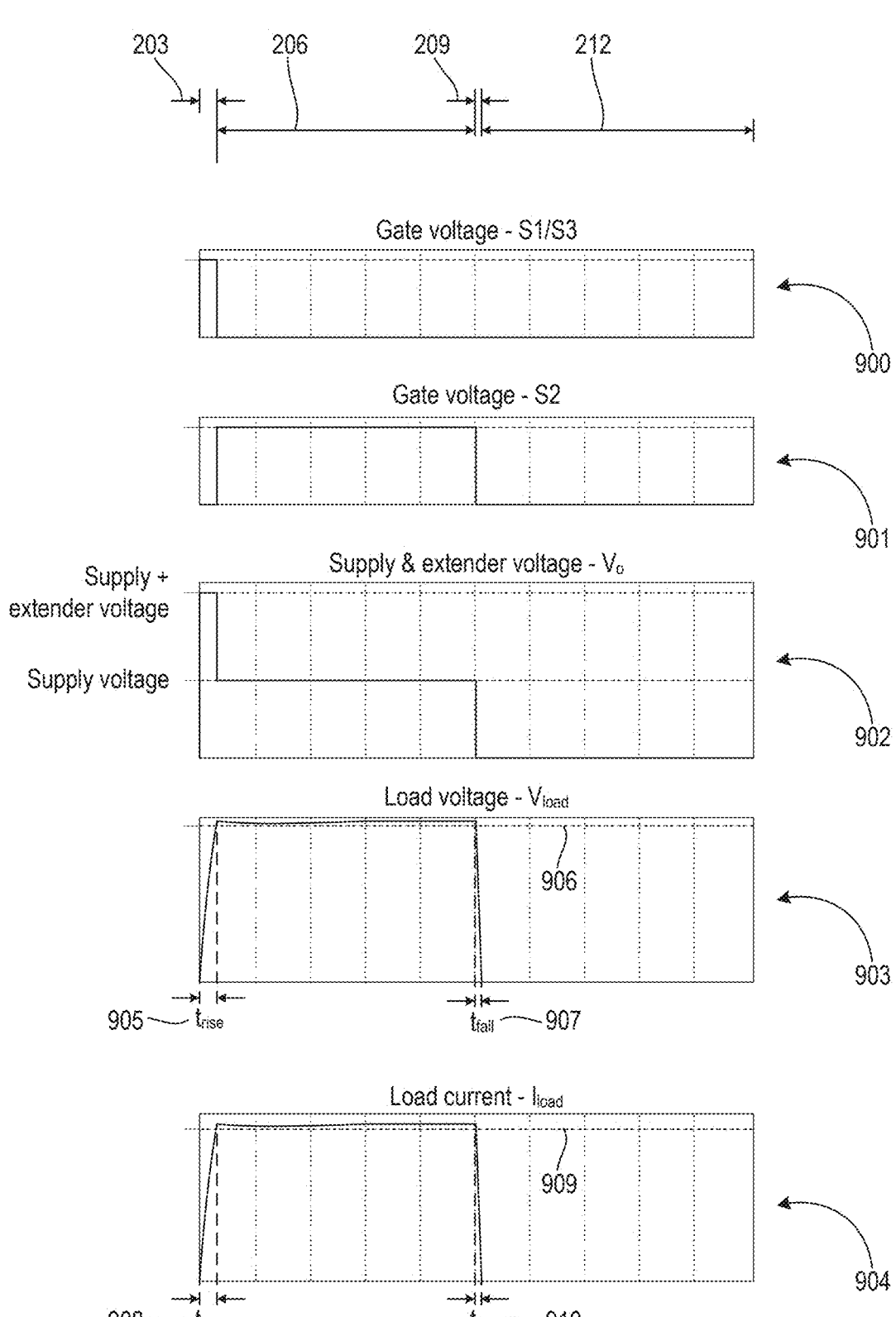
FIG. 9 illustrates a plurality of plots showing exemplary voltage and current waveforms based on the method of FIG. 2 according to an aspect of this disclosure.

FIG. 9 illustrates a plurality of plots 900-904 showing exemplary voltage and current waveforms based on the method of FIG. 2 according to an aspect of this disclosure. Gate voltages of the controllable switches 123, 129-130 of the switch assemblies S1, S3 during a single iteration of the first burst state control 202 are shown in plot 900. During the first burst width control state 203 of the method 200, the gate voltages of the controllable switches 123, 129-130 are high, resulting in the controllable switches 123, 129-130 being put into their on or conducting modes or states. During the second to fourth burst width control states 206, 209, 212, the gate voltages are low, putting the switches their off or non-conducting modes or states.

Gate voltages of the controllable switches 124-125 of the switch assembly S2 during a single iteration of the first burst state control 202 are shown in plot 901. During the first burst width control state 203 of the method 200, the gate voltages of the controllable switches 124-125 are low, resulting in the controllable switches 124-125 being put into their off or non-conducting modes or states. During the second burst width control state 206, the gate voltages of the controllable switches 124-125 are high, resulting in the controllable switches 124-125 being put into their on or conducting modes or states. During the third and fourth burst width control states 209, 212, the gate voltages are low, putting the switches their off or non-conducting modes or states.

Plot 902 illustrates the voltage on the output voltage (Vo) node 122 contributed by the base PSU 105 and the extender PSU 106 during the execution of the first burst state control 202. During the first burst width control state 203 of the method 200, the voltage of the Vo node 122 is a combination of the base PSU 105 and the extender PSU 106, which are combined in series across the input terminals 113, 115. During the second burst width control state 206, the voltage from the extender PSU 106 is removed, and the voltage from the base PSU 105 remains. During the third and fourth burst width control states 209, 212, the base PSU 105 and the extender PSU 106 contribute no voltage to the Vo node 122.

Plot 903 illustrates the voltage on the load voltage (Vload) node 139 during the execution of the first burst state control 202. During the first burst width control state 203 of the method 200, the voltage of the Vload node 139 rises over the rise time 905 from zero toward the target load voltage 906.

Based on detecting that the load voltage has reached the threshold of the target load voltage 906, the load sensor 138 transmits a signal to the controller 137 to indicate the reaching of the target load voltage 906. In response, the controller 137 changes from the first burst width control state 203 to the second burst width control state 206, which includes the voltage at the Vload node 139 having sufficient voltage to meet the demands of the load 102. During the third burst width control state 209, the voltage at the Vload node 139 decreases over the fall time 907. In response to the load sensor 138 reporting a loss of load current through the load 102, the controller 137 changes to the fourth burst width control state 212, during which the voltage of the Vload node 139 is zero.

Plot 904 illustrates the load current through the load voltage (Vload) node 139 during the execution of the first burst state control 202. During the first burst width control state 203 of the method 200, the current through the Vload node 139 rises over the rise time 908 from zero toward the target load current 909. Based on detecting that the load current has reached the threshold of the target load current 909, the load sensor 138 transmits a signal to the controller 137 to indicate the reaching of the target load current 909. In response, the controller 137 changes from the first burst width control state 203 to the second burst width control state 206, which includes the current through the Vload node 139 having sufficient current to meet the demands of the load 102. During the third burst width control state 209, the current through the Vload node 139 decreases over the fall time 910. In response to the load sensor 138 reporting a loss of load current through the load 102, the controller 137 changes to the fourth burst width control state 212, during which the current through the Vload node 139 is zero.

Embodiments of this disclosure allow for minimization of rise and fall times in pulses sent to a load over an inductive medium such as a cable having an inherent inductance when used to transmit pulses. Further, power supply units previously deemed unworthy to transmit high-frequency pulses can be used. A configurable fast transition PSU presented herein includes a base PSU that is a main source of power delivery to the load. It is always on during system operation regardless of the states of the S1 or S2 switches. The base capacitor assists the base PSU during transitions. The extender PSU assists on fast ramp up transitions and is also always on during system operation regardless of the states of the S1 or S2 switches. The extender capacitor is charged via the extender PSU. A fast transition clamp includes passive components and controllable switches to assist on fast ramp down transitions. It also recovers stored cable inductance energy on ramp down transitions in a clamp capacitor that is diverted back to the base and extender capacitors on fast ramp up transitions.

Embodiments of this disclosure present a configurable fast transition PSU having a base PSU and an extender PSU. The base PSU may be a standard configurable PSU that is a main source that delivers power to the load. It is always on during the power system operation regardless of the state of the switch assembly S1. The base capacitor assists the base PSU on transitions. The extender PSU may be a standard configurable PSU that assists during fast ramp-up transitions. It is always on during the power system operation regardless of the state of the switch assembly S2, and further acts as a capacitor charger for the extender capacitor.

In one example, the base PSU may be set to supply a voltage of 20V and a current limited to 1000 A while the extender PSU may be set to supply a voltage of 24V and a current limited to 100 A. The ratio of the base PSU current to extender PSU current may thus be 10:1 in this example. Other voltages and currents for each PSU may be different in other scenarios, however. In another example, the base PSU has a capacity of 24V/1000 A while the extender PSU has a capacity of 24V/200 A. In this example, the current capacity ratio is 5:1.

While the invention has been described in detail in connection with only a limited number of embodiments, it should be readily understood that the invention is not limited to such disclosed embodiments. Rather, the invention can be modified to incorporate any number of variations, alterations, substitutions, or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the invention is not to be seen as limited by the foregoing description but is only limited by the scope of the appended claims.

What is claimed is:

1. A system for supplying an energy pulse to a load, the system comprising:
   a first power supply unit (PSU);
   a second PSU coupled in series with the first PSU;
   a pulse switch circuit comprising:
      a voltage input coupled with the first PSU and with the second PSU;
      a voltage output;
      a first switch assembly coupled in series between the first PSU and the voltage output;
      a second switch assembly coupled in series between the second PSU and the voltage output; and
      a clamp circuit coupled across the voltage output;
   a sensor coupled to the load; and
   a controller to control the first switch assembly, the second switch assembly, and the clamp circuit based on an input received from the sensor.

2. The system of claim 1, wherein the pulse switch circuit further comprises:
   a first capacitor coupled in parallel with the first PSU; and
   a second capacitor coupled in parallel with the second PSU.

3. The system of claim 1, wherein the first switch assembly comprises a pair of controllable switches; and
   wherein the second switch assembly comprises a single controllable switch.

4. The system of claim 3, wherein each controllable switch of the pair of controllable switches comprises a metal-oxide semiconductor field-effect transistor (MOSFET); and
   wherein the single controllable switch comprises a MOSFET.

5. The system of claim 4, wherein a source terminal of a first MOSFET of the pair of controllable switches is coupled in series with a source terminal of a second MOSFET of the pair of controllable switches;
   wherein a drain terminal of the first MOSFET is coupled in series with the first PSU; and
   wherein a drain terminal of the second MOSFET is coupled in series with the voltage output.

6. The system of claim 1, wherein the clamp circuit comprises:
   a clamp capacitor;
   a first controllable switch coupled between the clamp capacitor and a first output of the voltage output;

a second controllable switch coupled between the clamp capacitor and a second output of the voltage output;

a first diode coupled between the clamp capacitor and the first output;

a second diode coupled between the clamp capacitor and the second output;

a third diode coupled in parallel with the first controllable switch; and a fourth diode coupled in parallel with the second controllable switch.

7. The system of claim 6, wherein the controller is configured to:

turn on the second switch assembly simultaneously with the first and second controllable switches during a first portion of a pulse period; and in response to signal from the sensor:

turn off the second switch assembly and the first and second controllable switches; and turn on the first switch assembly during a second portion of the pulse period.

8. A pulse switch circuit comprising:

a first voltage input comprising a first input terminal configured to receive energy from a first power supply unit (PSU);

a second voltage input comprising an input terminal configured to receive energy from a second PSU;

a voltage output;

a first switch assembly coupled in series between the first input terminal of the first voltage input and the voltage output;

a second switch assembly coupled in series between the input terminal of the second voltage input and the voltage output;

a clamp circuit coupled to the voltage output; and a controller configured to control the first switch assembly, the second switch assembly, and the clamp circuit to generate an energy pulse to a load.

9. The pulse switch circuit of claim 8 further comprising:

a second input terminal of the first voltage input;

a first capacitor coupled in parallel between the first and second input terminals of the first voltage input; and a second capacitor coupled in parallel between the first input terminal of the first voltage input and the input terminal of the second voltage input.

10. The pulse switch circuit of claim 9, wherein the controller is further configured to control the first switch assembly into a non-conducting mode and the second switch assembly into a conducting mode during a first portion of a pulse cycle to cause energy stored in the first capacitor and in the second capacitor to be supplied to the voltage output in series.

11. The pulse switch circuit of claim 10, wherein the controller is further configured to control the first switch assembly into a conducting mode and the second switch assembly into a non-conducting mode during a second portion of the pulse cycle to cause energy supplied to the first input terminal from the first PSU to be supplied to the voltage output and to prevent energy supplied to the input terminal of the second voltage input from the second PSU from being supplied to the voltage output.

12. The pulse switch circuit of claim 11, wherein the clamp circuit comprises:

a clamp switch assembly coupled in parallel between a pair of output terminals of the voltage output and comprising:

a pair of controllable switches; and a clamp capacitor coupled in series between the pair of controllable switches;

wherein the controller is further configured to:

control the clamp switch assembly into a conducting mode during the first portion of the pulse cycle to cause energy stored in the clamp capacitor to be supplied to the voltage output; and control the clamp switch assembly into a non-conducting mode during the second portion of the pulse cycle.

13. The pulse switch circuit of claim 12, wherein the clamp circuit further comprises:

a first diode coupled between the clamp capacitor and a first output terminal of the pair of output terminals; and a second diode coupled between the clamp capacitor and a second output terminal of the pair of output terminals;

wherein the controller is further configured to control each of the first switch assembly, the second switch assembly, and the clamp switch assembly into a non-conducting mode during a third portion of the pulse cycle; and wherein the first and second diodes supply charging energy to the clamp capacitor in response to an energy being supplied to the pair of output terminals during the third portion of the pulse cycle.

14. The pulse switch circuit of claim 12, further comprising:

a snubber circuit coupled in parallel with the clamp circuit and comprising:

a snubber resistor; and a snubber capacitor coupled in series with the snubber resistor.

15. A method of controlling a pulse switch circuit to generate an energy pulse for a load, the pulse switch circuit comprising a base voltage input, an extender voltage input, a voltage output, a base switch assembly coupled in series between the base voltage input and the voltage output, an extender switch assembly coupled in series between the extender voltage input and the voltage output, a base capacitor, an extender capacitor, a clamp circuit coupled in parallel across the voltage output, and a controller, the method comprising:

controlling the base switch assembly into a non-conducting mode and the extender switch assembly into a conducting mode during a first portion of a pulse cycle to cause energy stored in the base capacitor and in the extender capacitor to be supplied to the voltage output in series;

in response to a first operating condition, controlling the base switch assembly into the conducting mode and the extender switch assembly into the non-conducting mode during a second portion of the pulse cycle to cause energy supplied to the base voltage input via a base power supply unit (base PSU) to be supplied to the voltage output and to prevent energy supplied to the extender voltage input via an extender PSU from being supplied to the voltage output;

in response to a second operating condition, controlling the base switch assembly and the extender switch assembly into the non-conducting mode during a third portion of the pulse cycle; and storing energy supplied to the voltage output in the clamp circuit during the third portion of the pulse cycle.

16. The method of claim 15, wherein the first operating condition comprises receiving, via the controller, a signal from a load sensor; and wherein the signal is configured to indicate a threshold amount of energy reached by the energy supplied to the load from the voltage output via a cable.

17. The method of claim 15, wherein the second operating condition comprises a time duration of an energy pulse supplied to the load from the voltage output.

18. The method of claim 15, wherein the clamp circuit comprises a clamp switch assembly comprising a pair of controllable switches and a clamp capacitor coupled in series between the pair of controllable switches; and wherein the method further comprises controlling the pair of controllable switches into the conducting mode during the first portion of the pulse cycle to cause energy stored in the clamp capacitor to be supplied to the voltage output.

19. The method of claim 18, wherein the clamp circuit further comprises:

a first diode; and a second diode, wherein the first and second diodes are coupled in series with the clamp capacitor across the voltage output;

wherein storing energy supplied to the voltage output in the clamp circuit during the third portion of the pulse cycle comprises storing the energy in the clamp capacitor.

20. The method of claim 15, wherein controlling the base switch assembly into the non-conducting mode and the extender switch assembly into the conducting mode during the first portion of the pulse cycle further causes energy supplied to the extender voltage input by the base PSU and the extender PSU connected in series to be supplied to the voltage output.

* * * * *